United States Patent
Goldbach et al.

(10) Patent No.: US 6,559,069 B2
(45) Date of Patent: May 6, 2003

(54) PROCESS FOR THE ELECTROCHEMICAL OXIDATION OF A SEMICONDUCTOR SUBSTRATE

(75) Inventors: Matthias Goldbach, Dresden (DE); Albert Birner, Dresden (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/215,151

(22) Filed: Aug. 8, 2002

(65) Prior Publication Data

US 2003/0032304 A1 Feb. 13, 2003

(30) Foreign Application Priority Data

Aug. 8, 2001 (DE) .......................... 101 38 981

(51) Int. Cl.⁷ .................... H01L 21/31; H01L 21/469; H01L 21/8242; H01L 21/76
(52) U.S. Cl. ................... 438/770; 438/248; 438/391; 438/408; 438/441
(58) Field of Search ................. 438/770, 248, 438/391, 408, 441

(56) References Cited

U.S. PATENT DOCUMENTS

| 5,759,903 A | 6/1998 | Lehmann et al. |
| 5,877,069 A * | 3/1999 | Robinson .................. 438/441 |
| 6,143,627 A | 11/2000 | Robinson |
| 6,287,936 B1 * | 9/2001 | Perea et al. .................. 438/409 |
| 6,309,983 B1 * | 10/2001 | Michaeli et al. ............ 438/788 |
| 6,352,893 B1 * | 3/2002 | Michaelis et al. .......... 438/248 |

FOREIGN PATENT DOCUMENTS

| DE | 100 27 931 C1 | 1/2002 |
| EP | 0 996 147 A1 | 4/2000 |
| EP | 1 016 621 A2 | 7/2000 |
| WO | WO 99/25026 | 5/1999 |
| WO | WO 00/75976 A1 | 12/2000 |
| WO | WO 01/17014 A1 | 3/2001 |

* cited by examiner

Primary Examiner—Alexander Ghyka
(74) Attorney, Agent, or Firm—Laurence A. Greenberg; Werner H. Stemer; Gregory L. Mayback

(57) ABSTRACT

In a process for the electrochemical oxidation of a semiconductor substrate that has recesses, such as for example, capacitor trenches or mesopores, formed in a silicon surface region, self-limited oxide formation takes place. The end of this formation is reached as a function of the process parameters such as the doping of the silicon region, the applied voltage and the composition of the electrolyte used, as soon as either a predetermined maximum layer thickness of the formed oxide or a predetermined minimum residual silicon layer thickness between two adjacent recesses is reached. The self-limiting is achieved either as a result of the overall voltage applied over the silicon oxide layer, which has already formed, dropping or as a result of the space charge regions of adjacent recesses coming into contact with one another.

9 Claims, 6 Drawing Sheets

FIG 8A

PROCESS FOR THE ELECTROCHEMICAL OXIDATION OF A SEMICONDUCTOR SUBSTRATE

BACKGROUND OF THE INVENTION

FIELD OF THE INVENTION

The present invention relates to a process for the electrochemical oxidation of a semiconductor substrate that has recesses formed in a silicon surface region. The invention relates, in particular, to the formation of oxide in trenches, for example, capacitor trenches, or mesopores which are formed in a silicon substrate.

The present invention can be used particularly advantageously for fabricating DRAM (dynamic random access memory) memory cells. Memory cells of this type, which are produced almost exclusively as single-transistor memory cells, generally include a read transistor and a storage capacitor. The information is stored in the storage capacitor in the form of an electric charge that represents a logic 0 or a logic 1. Actuating the read transistor via a word line allows this information to be read via a bit line. The storage capacitor must have a minimum capacitance for reliably storing the charge, and to make it possible to differentiate the information item which has been read. The lower limit for the capacitance of the storage capacitor is currently considered to be 25 fF.

Since the storage density increases from memory generation to memory generation, the surface area required by the single-transistor memory cell must be reduced from generation to generation. At the same time, the minimum capacitance of the storage capacitor has to be retained.

Up to the 1 Mbit generation, both the read transistor and the storage capacitor were produced as planar components. Beyond the 4 Mbit memory generation, the area taken up by the memory cell was reduced further by using a three-dimensional arrangement of the read transistor and the storage capacitor. One possibility is for the storage capacitor to be produced in a trench. In this case, a diffusion region that adjoins the wall of the trench and a doped polysilicon filling arranged in the trench act as electrodes for the storage capacitor. Therefore, the electrodes of the storage capacitor are arranged along the surface of the trench. In this way, the effective surface area of the storage capacitor, on which the capacitance is dependent, is increased with respect to the space taken up by the storage capacitor on the surface of the substrate, which corresponds to the cross section of the trench. By reducing the cross section of the trench, it is possible to further increase the packing density. However, for technological reasons there are limits on the extent to which the depth of the trench can be increased.

However, the effective surface area of the storage capacitor and therefore the capacitance of the capacitor can be increased by measures which increase the surface area, such as for example, widening the capacitor trench in the lower region, etching mesopores or by the HSG (hemi-spherical grain) process (roughening of the silicon surface), without increasing the space taken up in the horizontal plane as a result.

As will be explained below, the present invention can be applied particularly advantageously to widening existing recesses. Furthermore, an important application area is the formation of oxide on special geometric structures.

Electrically insulating layers of oxides or nitrides play a very important role in the fabrication of DRAM memory cells. While in earlier DRAM generations, these layers were generally used in planar form and were produced by deposition and/or heat treatment and were then patterned. Since the introduction of the capacitor trenches, increased emphasis has been placed on integrating dielectrics in the form of cylinder jackets (for example as insulation collars for disconnecting a parasitic transistor) or in the form of reagent glasses (for example the node capacitor dielectric).

Hitherto, oxide layers have generally been formed by thermal oxidation under dry or wet conditions (furnace processes) or by deposition. In these processes, the thickness of the oxide layers can be controlled very successfully by setting the reaction time, for example.

In particular in order to widen, for example, capacitor trenches or mesopores, sacrificial oxide layers are used and are subsequently removed again. In this case or also in the case of oxidation of thin active silicon layers of SOI substrates, there may in particular be a need for the silicon material which is present, for example, below the sacrificial oxide layer to be converted into oxide apart from a defined residual thickness. In the processes described above, this can only be achieved by complex process control.

U.S. Pat. No. 6,143,627 discloses a process for the electrochemical oxidation of silicon. In this process, certain parts of a silicon substrate are covered by a nonconductive layer and the silicon substrate is brought into contact with an electrolyte. A voltage is applied between a cathode in the electrolyte and the silicon substrate, so that a reaction between silicon and the electrolyte to form silicon dioxide takes place at the uncovered surface regions of the silicon substrate. A different layer thickness is achieved depending on the applied voltage and the reaction time. According to the invention described in this patent, there is no limiting of the layer growth, i.e. in the diagram shown in FIG. 5 of the patent, the layer thickness grows in strictly monotonous fashion and there is no saturation. Furthermore, no recesses whatsoever are formed in the silicon surface region.

SUMMARY OF THE INVENTION

It is accordingly an object of the invention to provide a process for the electrochemical oxidation of a semiconductor substrate with which a predetermined oxide thickness is produced in recesses in a silicon surface region or with which a minimum silicon layer thickness remains between two adjacent recesses.

With the foregoing and other objects in view there is provided, in accordance with the invention, a process for an electrochemical oxidation of a semiconductor substrate, which includes steps of: providing a semiconductor substrate having at least one surface region formed with recesses being spaced apart from one another by a spacing, said surface region having silicon and a predetermined doping; providing an electrolyte in contact with the surface region; applying a voltage between the semiconductor substrate and a cathode configured in the electrolyte to bring about a reaction between the surface region and the electrolyte in order to form silicon oxide; determining that the electrochemical oxidation has ended based on a self-limiting effect; and interrupting the voltage between the semiconductor substrate and the cathode.

In accordance with an added feature of the invention, the self-limiting effect is brought about as a result of reaching a predetermined oxide thickness when the voltage between the semiconductor substrate and the electrolyte is a given voltage and when the electrolyte has a given composition.

In accordance with an additional feature of the invention, the self-limiting effect is brought about as a result of a layer thickness between two adjacent ones of the recesses falling below a minimum residual silicon layer thickness when the voltage between the semiconductor substrate and the electrolyte is a given voltage and when the electrolyte has a given composition.

In accordance with another feature of the invention, the process includes: setting the voltage and a composition of the electrolyte such that a following relationship applies:

$d \geq 2*$(an extent of the space charge region+an oxide thickness that will be produced);

where d is a layer thickness of the silicon that is between two adjacent ones of the recesses. The extent of the space charge region is dependent on a level of an effective voltage acting over the space charge region, and the effective voltage is dependent on the voltage that is applied and a composition of the electrolyte.

In accordance with a further feature of the invention, the electrolyte includes an agent for etching silicon oxide.

In accordance with a further added feature of the invention, the process is used to oxidize faces of capacitor trenches.

In accordance with yet an added feature of the invention, the process is used to oxidize surfaces of mesopores.

In accordance with yet an additional feature of the invention, the process is used to widen diameters of trenches to form trench capacitors.

In accordance with yet another feature of the invention, the process is used to widen diameters of mesopores.

Figure 2:
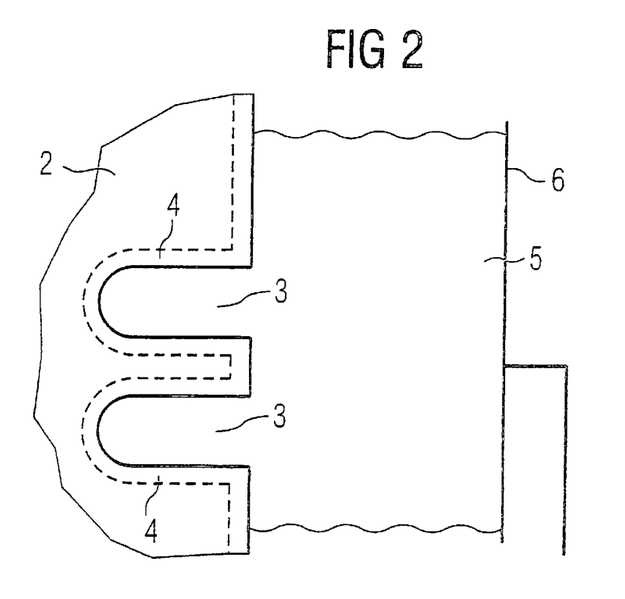
FIG. 2 shows an enlarged view of the recesses shown in FIG. 1 in contact with the electrolyte.

As shown in FIG. 2, recesses 3 are arranged in the silicon region 2, and the silicon region 2 is brought into contact with an electrolyte 5. A voltage is applied between the semiconductor substrate 1, which acts as an anode, and a cathode 6 in the electrolyte 5. The contact between the electrolyte 5 and the silicon region 2 may be thought of as a Schottky contact. Accordingly, a space charge region 4, the extent of which is indicated by dashed lines, is formed at the interface in the silicon region 2. As is generally known, the width of the space charge region 4 in a Schottky contact is dependent, inter alia, on the effective voltage acting at the silicon surface and on the doping of the silicon region.

At the beginning of the oxidation, the space charge regions 4 of adjacent recesses 3 are not yet in contact with one another. There is a field across the space charge region, through which oxygen ions and OH⁻ groups diffuse from the electrolyte into the silicon surface region, where they convert the silicon into $SiO_x$.

This diffusion and therefore the oxide formation take place until the electric field is at the silicon surface region. In other words, as soon as the electric field is constricted as a result of the space charge regions 4 of adjacent recesses coming into contact with one another, or the oxide layer produced is so thick that all of the voltage that is present drops off over the oxide layer, the oxide formation comes to a standstill.

Therefore, self-limited oxide formation takes place. The end of which is reached, as a function of the process parameters, such as, the doping of the silicon region, the applied voltage and the composition of the electrolyte used, as soon as either a predetermined maximum layer thickness of the formed oxide or a predetermined minimum residual silicon layer thickness between two adjacent recesses is reached.

The self-limiting effect can occur in particular because the oxide formation takes place in the recesses that are present in the silicon surface region.

This is explained in more detail with reference to FIGS. 3 to 5.

Figure 3:
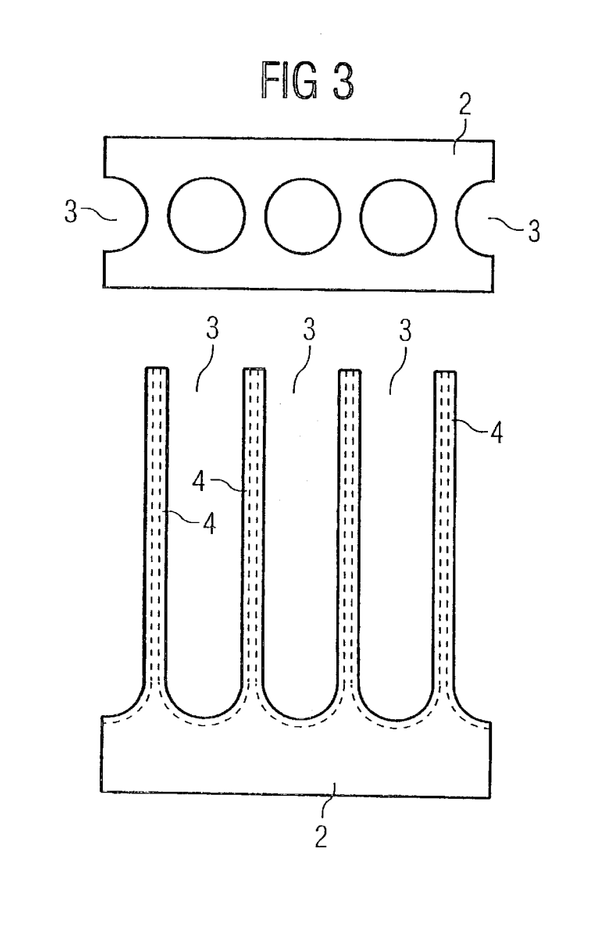
FIG. 3 shows a plan view and a cross-sectional view of a trench arrangement before the inventive process is carried out.
Figure 4:
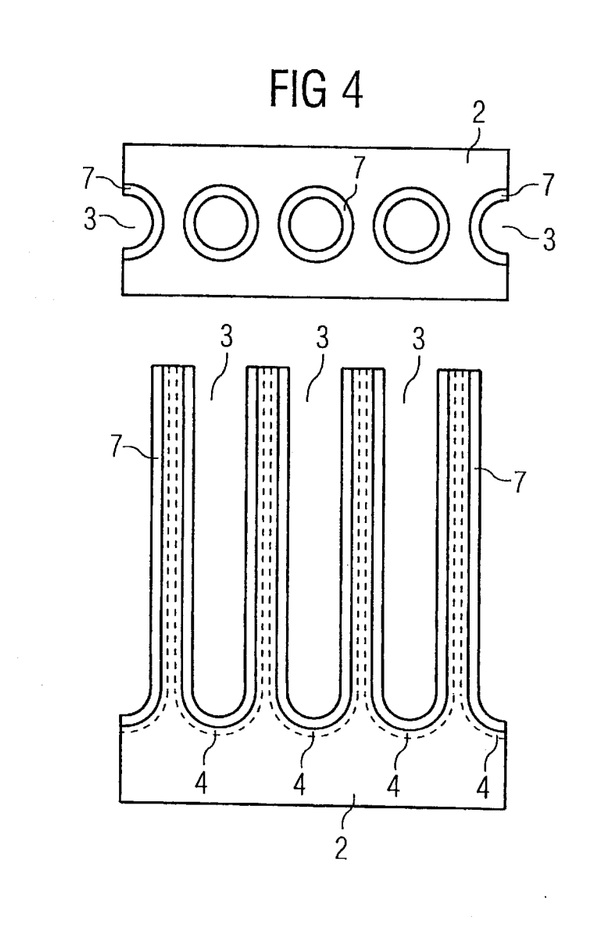
FIG. 4 illustrates the self-limiting of the oxide formation for a predetermined maximum oxide thickness.

FIG. 3 shows the arrangement of, for example, capacitor trenches 3 before the oxide formation, while FIG. 4 shows the capacitor trenches 3 after the oxide formation. The extent of the space charge regions 4 is once again indicated by dashed lines. The upper part of FIGS. 3 and 4 in each case show a plan view of a cross section parallel to the substrate surface, while the lower part of FIGS. 3 and 4 in each case show a cross section perpendicular to the substrate surface.

As shown in FIG. 4, for the set parameters of the oxide formation, the further formation of oxide is prevented as a result of all of the active voltage dropping off over the thickness of the formed oxide layer that has already been reached, so that the oxygen ions and OH⁻ groups no longer diffuse into the silicon surface region. As a result, as shown in the upper part of FIG. 4, a concentric silicon oxide layer is formed in the recess 3.

Depending on the voltage applied, the oxide layer may be a few nm (nanometers) to over 10 nm thick before the oxide growth stops.

Figure 5:
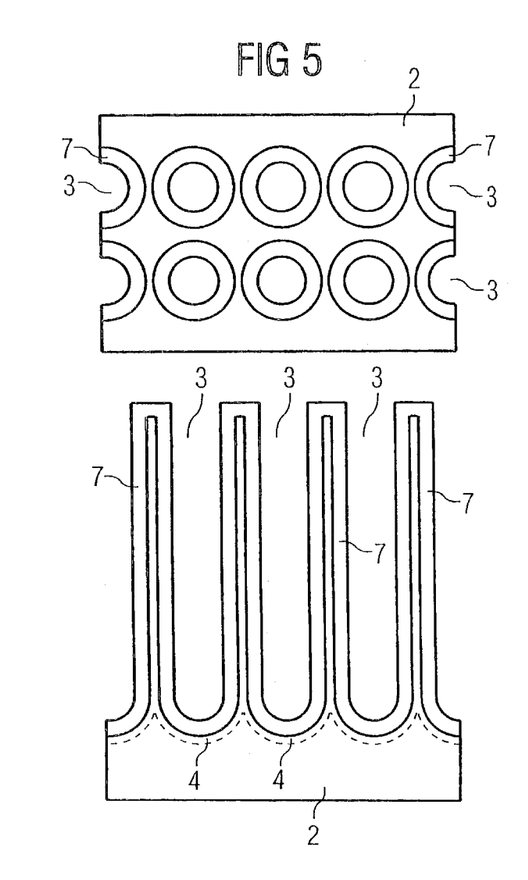
FIG. 5 illustrates the self-limiting of the oxide formation for a predetermined minimum residual silicon layer thickness.

FIG. 5 shows the arrangement of, for example, capacitor trenches after the oxide formation. In this case, the further growth of oxide is prevented as a result of the space charge regions 4 of adjacent trenches 3 coming into contact with one another. Once again, the extent of the space charge regions 4 is indicated by dashed lines. The upper-part of FIG. 5 shows a plan view of a cross section parallel to the substrate surface, while the lower part of FIG. 5 shows a cross section perpendicular to the substrate surface.

In the arrangement shown in FIG. 5, the further growth of oxide is prevented as a result of the space charge regions 4 of adjacent trenches 3 coming into contact with one another.

More precisely, as shown in the lower part of FIG. 5, when a corresponding voltage is applied, the silicon rib between adjacent trenches is formed completely as a space charge region 4, so that at this region there is a very high resistance and therefore there is no longer any field acting at the trench surface through which oxygen ions and OH⁻ groups could diffuse from the electrolyte into the silicon surface region, where they could convert the silicon into $SiO_x$.

In this case, the thickness of the silicon oxide layer, which has already formed, is much too small in relation to the applied voltage for it to be of importance with regard to limiting the oxide growth. Limiting the oxide growth is achieved only as a result of the space charge regions growing together.

Taking account of the rule that a width of the space charge region of 100 nm corresponds to a resistivity of the silicon substrate of 10 mΩcm, this resistivity being dependent on the doping of the silicon substrate, the residual silicon layer thickness between adjacent recesses can be estimated for a given doping.

As can be seen from the upper part of FIG. 5, the oxide layer adopts a different form from that shown in FIG. 4.

If the further growth of oxide is stopped as a result of the space charge regions of adjacent recesses coming into contact with one another, geometry-dependent influences, such as for example, the arrangement of the pores in adjacent trenches and therefore a premature stop to growth in the directions in which the trenches are narrowest, can also lead to the formation of direction-dependent oxide layers. In particular, by way of example, in the arrangement shown in FIG. 5, only a very thin silicon oxide layer grows on the tips of the silicon ribs between adjacent trenches, since on account of the space charge regions which are forming, depending on the voltage applied, the electric field is largely constricted in the uppermost region of the rib.

Which of the mechanisms that have been described is actually active in limiting the oxide growth is dependent in particular on the doping of the silicon substrate, the size of the recesses formed in the silicon surface region, and the voltage which effectively acts on the substrate surface.

The end point of the electrochemical oxidation can be detected, for example, as a result of no further current flowing between the anode and the cathode. Furthermore, end point detection by measuring current has the advantage that it can easily be automated. The current is monitored by a measuring device and is compared with a threshold value. If the current falls below the threshold value, this is interpreted as indicating the end point of the oxidation. However, other end point detection processes are also conceivable, for example, by monitoring the composition of the electrolyte. As soon as the electrochemical oxidation has ended, the voltage between semiconductor substrate and cathode is interrupted.

According to the present invention, the thickness of the silicon oxide layer that will be produced or the thickness of the residual silicon layer between adjacent recesses can be controlled substantially by two parameters.

One parameter is the applied voltage. If the further growth of oxide is limited by the thickness of the oxide layer which has already been deposited, the electric field which is effectively active and causes the oxygen ions and OH⁻groups to penetrate into the silicon substrate is given first by the thickness of the oxide layer that has been deposited and second by the level of the applied voltage. The higher the applied voltage, the larger the oxide layer which can be deposited.

By contrast, if the further growth of oxide is limited by the fact that adjacent space charge regions come into contact with one another, the width of the space charge region is, as is known from the theory of Schottky contacts, dependent on the root of the applied voltage. What this means is that the higher the applied voltage, the larger the space charge region becomes. Therefore, the higher the applied voltage, the larger the residual silicon layer between adjacent recesses becomes.

The second parameter involved in setting the oxide thickness which is to be deposited and/or the residual silicon layer is the composition of the electrolyte. Since the voltage is applied between the cathode in the electrolyte and the anode in the silicon substrate, the electric field which is effectively active at the substrate surface is dependent in particular on the conductivity and the pH of the electrolyte. An important factor in this context is the proportion of the voltage that drops off over the electrolyte. For example, when an electrode with a relatively high conductivity is used, with the same voltage applied, a thicker layer of oxide can be deposited then when an electrolyte of lower conductivity is used.

The electrolyte may advantageously contain an agent for etching silicon oxide, such as for example, traces of hydrofluoric acid, if the process according to the invention is going to be used to widen recesses. As a result, the silicon oxide is partially dissolved during the oxidation process, so that the silicon is uniformly removed.

According to the present invention, the voltage and the composition of the electrolyte are preferably set in such a manner that the following relationship applies:

$$d \geq 2*(\text{the extent of the space charge region} + \text{the oxide thickness that will be produced}).$$

The extent of the space charge region is dependent on the level of the effective voltage acting over the space charge region and is dependent on the applied voltage and the composition of the electrolyte, and d indicates the wall thickness between two adjacent recesses. If an agent for etching silicon oxide has already been added to the electrolyte, the formula is reduced to:

$$d \geq 2*(\text{the extent of the space charge region})$$

According to the present invention, it is possible in particular for dilute acids, such as for example, a 0.01 mol $H_2SO_4$ (sulphuric acid) or a 0.01 mol HCl (hydrochloric acid) or also other known electrolytes for the electrochemical oxidation, such as for example, $NH_4OH$ (ammonium hydroxide) to be used as a liquid electrolyte.

The electrochemical oxidation takes place in particular in p-doped or n-doped silicon regions, with the standard dopant concentrations. Typical voltages between the anode and cathode are in a range from 0 volts to a few tens of volts.

The present invention can be used particularly advantageously to oxidize the surface of the capacitor trench, for example in order to form a sacrificial oxide layer which during the subsequent process is removed again at a suitable location. The invention can also be used to oxidize the surface of mesopores, for example, in order to widen them during the subsequent etching of the oxide layer.

Furthermore, the present invention can advantageously be used to widen the diameter of a trench in order to form a trench capacitor or to widen the diameter of mesopores, either as described above, during subsequent etching, or during simultaneous etching of the silicon oxide layer.

Overall, the present invention provides the following advantages:

The process of the present invention allows oxide to be formed uniformly with a predetermined thickness, or allows residual silicon layer thickness to be formed on patterned silicon surfaces of any desired geometry.

The fact that the silicon oxide is formed from the silicon that is present in the silicon surface region means that silicon material is "consumed". Accordingly, the process according to the invention can advantageously be used to widen the diameter of recesses, such as for example, capacitor trenches or mesopores.

If the process according to the invention is used to apply a silicon oxide layer, for example, as a sacrificial layer, the diameter of the recess is thereby reduced to only a limited extent.

The self-limiting of the oxide formation means that it is possible to set the silicon oxide layer thickness formed or the residual silicon layer thickness.

Compared to thermal oxidation, in the case of anodic oxidation, the thermal budget required is reduced considerably.

The oxide layer that is formed has the same thickness irrespective of the crystal orientation, which in the case of thermal oxidation can only be achieved approximately with very hot processes.

Other features which are considered as characteristic for the invention are set forth in the appended claims.

Although the invention is illustrated and described herein as embodied in a process for the electrochemical oxidation of a semiconductor substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 6:
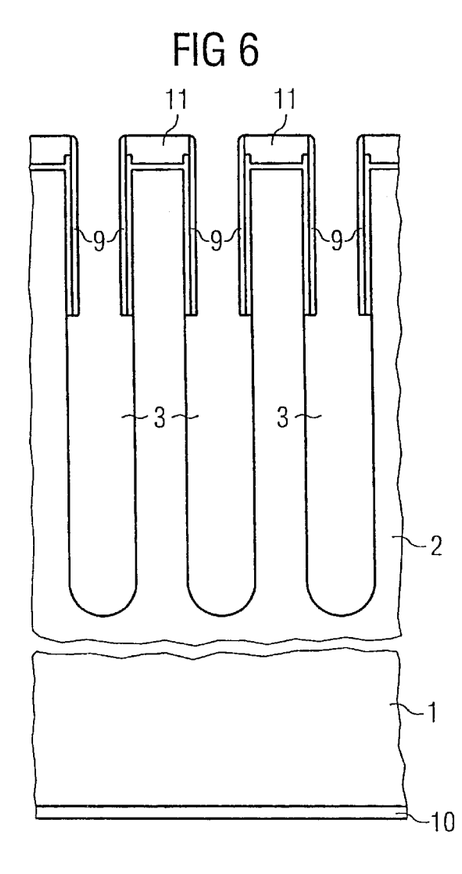
FIG. 6 shows a cross section through a silicon substrate before a first embodiment of the inventive process is carried out.

To fabricate the substrate shown in FIG. 6, first of all an ohmic back-surface contact 10 for the electrochemical oxidation is produced on the back surface of a silicon substrate 1. To ensure that the potential profile over the wafer back surface is as homogeneous as possible, it can be produced, for example, by using a highly conductive layer, for example, a highly doped layer or a metallic layer.

By way of example, a p-dopant, such as B, Al, In, Ga, Tl, can be introduced by ion implantation and subsequent activation at elevated temperature. Alternatively, however, it is also possible for a borosilicate glass to be deposited on the back surface and then for a heat treatment step to be carried out at an elevated temperature (usually greater than 700° C.), during which the boron atoms then pass into the substrate.

To produce the back-surface contact by using a metallic layer, it is possible to deposit a metal, such as for example, titanium or tungsten, or a metal compound, such as for example, tungsten nitride, tungsten silicide or titanium nitride. To avoid potential fluctuations, it is important that the metal/substrate transition does not have an ohmic contact.

Then, known processes are used to etch capacitor trenches in the silicon substrate in order to form trench capacitors of a DRAM memory cell arrangement. A detailed description of a process of this type is given, for example in International Publication WO 01/17014. Examples of typical trench spacings are 50 to 100 nm.

According to a first embodiment of the present invention, the capacitor trenches shown in FIG. 6 are widened by electrochemical oxidation. The trench regions in which no widening will take place are covered by a protective $Si_3N_4$ layer 9 which, for example, in conjunction with the silicon oxide layer below it, acts as an insulating collar in the finished DRAM memory cell. Furthermore, the substrate surface is covered by a protective $Si_3N_4$ layer 11 between the individual capacitor trenches.

Figure 1:
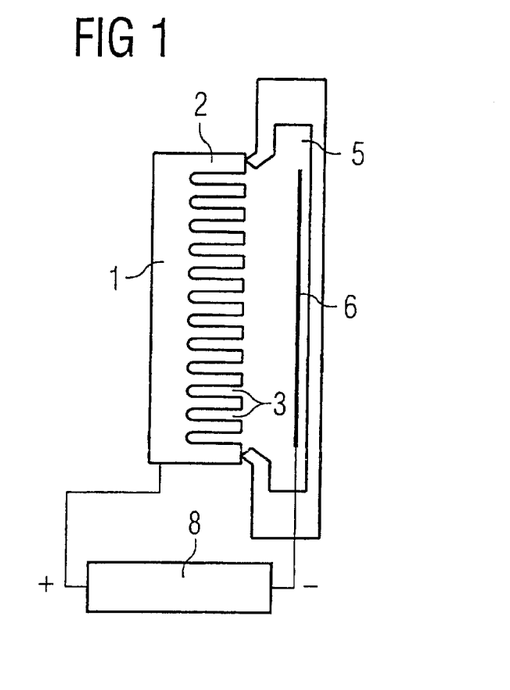
FIG. 1 shows a diagrammatic test structure for the anodic oxidation of a silicon surface.

FIG. 1 shows the basic arrangement for electrochemical processes carried out on a semiconductor substrate 1. The silicon surface 2 of the semiconductor substrate 1 into which the trenches 3 are etched is held on an electrochemical cell and is connected in a sealed manner to this cell via O-rings (not shown). The cell itself is filled with an aqueous, dilute acid (e.g. a 0.01 mol sulfuric or hydrochloric acid). In order to remove the silicon oxide layer that is formed simultaneously with the growth, traces of hydrofluoric acid are added.

The back-surface contact of the semiconductor substrate 1 is connected to the anode of a voltage source 8. Since the processing sequence described above means that insulating layers are usually applied to the highly conductive layer, contact is made either, if the highly conductive layer is produced as a metallic layer, by penetrating at least one contact needle through the insulating layer, or if the highly conductive layer is produced as a highly doped layer, by at least partially etching away the insulating layer. FIG. 6 shows a semiconductor substrate with an ohmic back-surface contact 10 including a highly doped layer, in which the insulating layer has been completely removed from the substrate back surface.

With regard to back-surface contacting of the semiconductor substrate, it is important to produce a large-area electrical contact to the substrate. Any known processes, such as those which are known, for example, from mesopore etching, can be used for this purpose.

Opposite the substrate surface, a cathode is arranged in the cell and is connected to the voltage source 8. The cathode used is typically a platinum mesh electrode with a mesh width of approx. 0.5 to 1 cm. A typical distance between the substrate surface and the cathode is 1 cm.

A voltage is applied to the voltage source 8 in accordance with a target widening of the capacitor trenches that will be achieved, i.e. a residual silicon layer thickness that will remain between the capacitor trenches. Typical voltages are between 0 and a few tens of Volts. At the start of the oxidation, the space charge regions of adjacent capacitor trenches are not yet in contact with one another. There is a field above the space charge regions in which oxygen ions and $OH^-$ groups diffuse from the electrolyte into the silicon surface and convert the silicon into $SiO_x$. This diffusion continues until the space charge regions of adjacent capacitor trenches come into contact with one another. This brings the further growth of oxide to a standstill. The fact that hydrofluoric acid is added to the electrolyte means that the silicon oxide that is formed is removed immediately, and the following relationship applies:

$$d \geq 2 * \text{extent of the space charge region;}$$

where d is the residual silicon layer thickness or wall thickness between two capacitor trenches.

The end point of the electrochemical oxidation is detected as a result of current no longer flowing between the anode and the cathode, and the voltage between the semiconductor substrate and the cathode is interrupted.

On account of the self-limiting effect, this widening process is advantageous because the capacitor trenches are widened without breaking through the silicon walls between adjacent trenches. The space charge regions of adjacent trenches would come into contact with one another before the silicon walls of adjacent trenches are broken through, and as described above, this stops the further formation of oxide immediately.

As soon as the formation of oxide has ended, if appropriate the ohmic back-surface contact is removed again if it disrupts the further process sequence. By way of example, the highly p-doped layer can be removed by wet chemical etching. Then, the method for fabricating a DRAM memory arrangement is continued in the usual way, for example as described in International Publication WO 01/17014.

According to a second embodiment of the present invention, the self-limited anodic oxidation is used for the electrochemical partial oxidation of mesopores in order to widen their diameter.

For this purpose, the silicon substrate shown in FIG. 6 together with its back-surface contact and its front side in which capacitor trenches have been etched, is initially prepared for the etching of mesopores. Then the mesopores are etched in the capacitor trenches. The trench regions in which no mesopores will be formed are once again covered with a protective $Si_3N_4$ layer 9, which in the finished DRAM memory cell, in conjunction with the silicon dioxide layer beneath it, will act as an insulating collar in order to disconnect a parasitic transistor. The substrate surface between the capacitor trenches is likewise covered with a protective $Si_3N_4$ layer 11.

The structure shown in FIG. 1, in which preferably a 3% strength aqueous hydrofluoric acid is used as an electrolyte, is used to etch the mesopores. The substrate back-surface contact connection is produced in the same way as that described with reference to the first exemplary embodiment.

Figure 7:
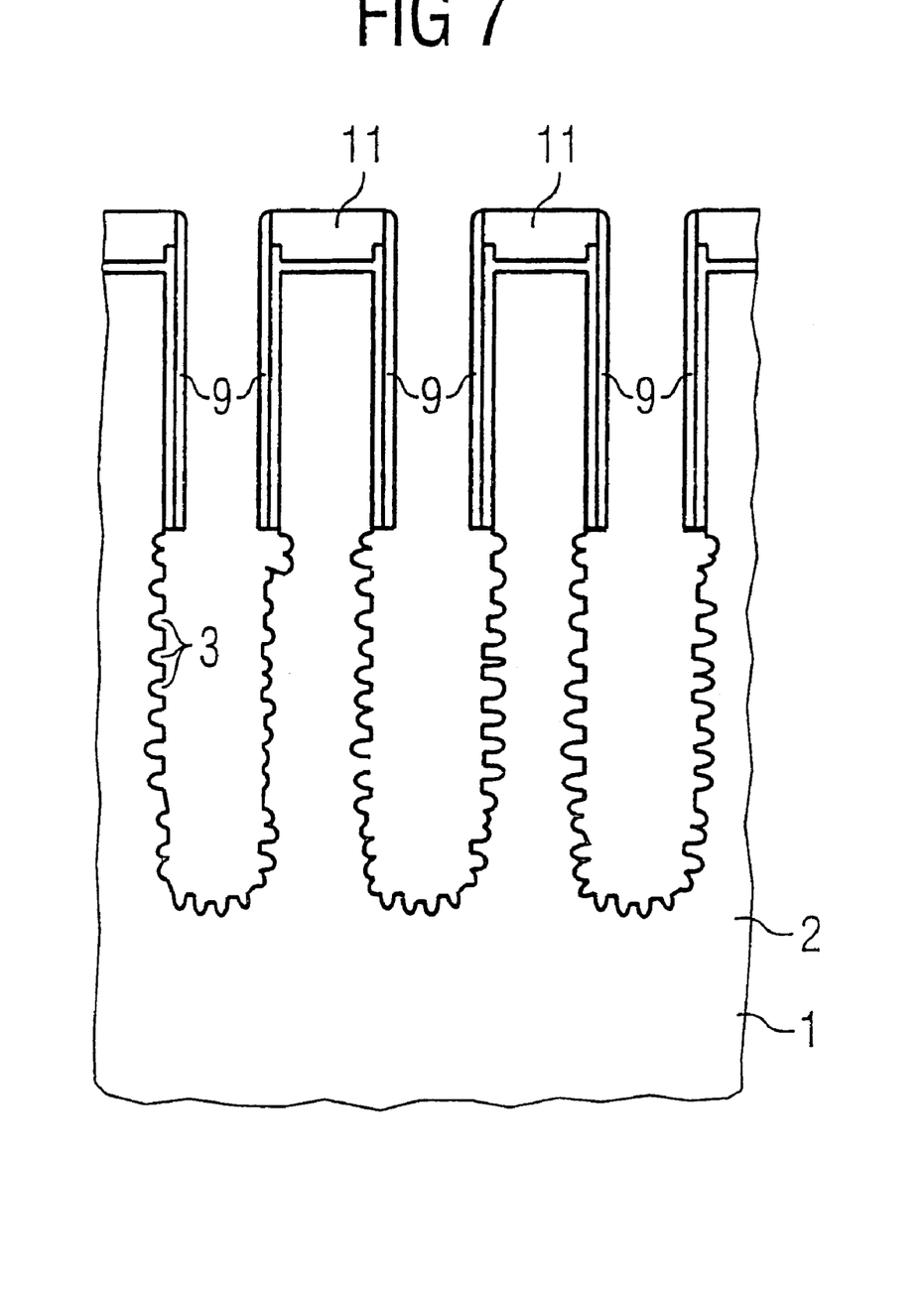
FIG. 7 shows a cross section through a silicon substrate before a second embodiment of the inventive process is carried out.

First of all, the mesopores are formed at the uncovered semiconductor regions that are not covered with the protective layer 9 or the protective layer 11. The result is the structure shown in FIG. 7, in which a typical mesopore spacing is 1 to 10 nm. Immediately after the electrochemical production, the mesopores have a diameter that is significantly too small for them to be filled with the node dielectric and the top electrode in order to complete the trench capacitor. Diameters of 5 to 10 nm are typically achieved during mesopore etching. Accordingly, a widening process, which allows the diameter to be widened to 20 to 30 nm, is necessary.

For this purpose, the electrolyte in the electrolytic cell is exchanged. Depending on whether the silicon oxide layer formed in the interior of the mesopores will be removed subsequently or simultaneously, by way of example, the electrolyte used is dilute sulfuric acid or hydrochloric acid (in each case 0.01 mol) with or without the addition of hydrofluoric acid. Setting the size of the space charge region using the applied voltage with a given substrate doping allows for adjustment of the width of the rib, which is still available as the bottom electrode of the trench capacitor after the oxidation and the subsequent or simultaneous removal of the oxide.

Figure 8A:
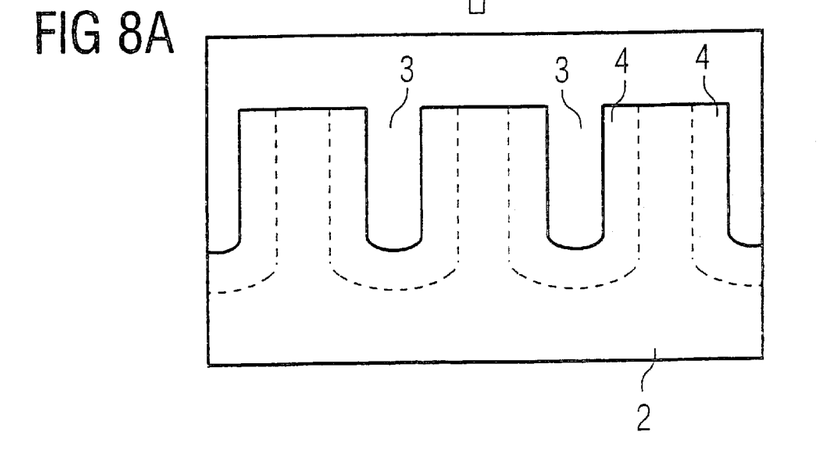
FIG. 8 shows a plan view and a cross-sectional view of a mesopore arrangement before and after the second embodiment of the inventive process has been carried out.
Figure 8B:
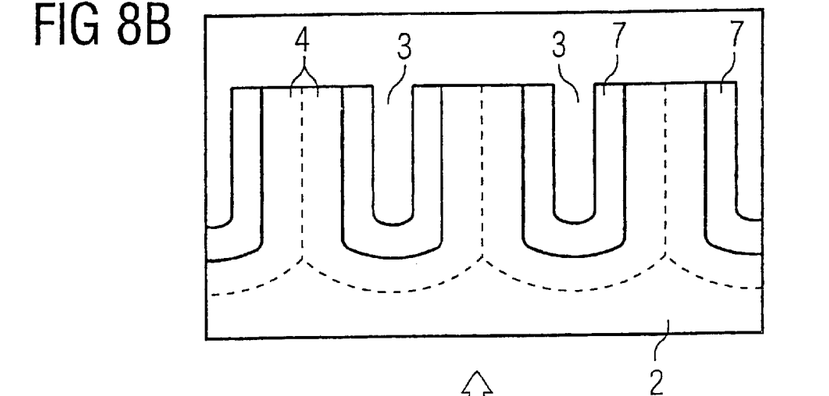
Figure 8C:
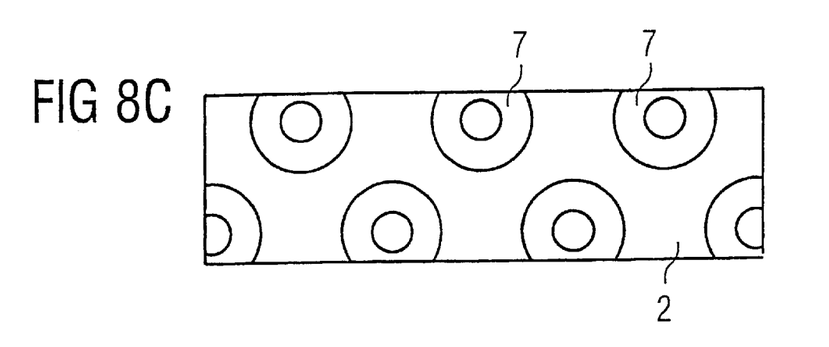

FIG. 8A shows a cross section perpendicular to the substrate surface through the mesopores before the oxide formation, while FIG. 8B shows a corresponding cross section after the oxide formation. As can be seen from FIGS. 8A and 8B, the space charge regions of adjacent mesopores do not come into contact with one another before the oxide formation, while at the end of the oxide formation they are in contact with one another. FIG. 8C shows a plan view of a cross section parallel to the substrate surface of the mesopores with the oxide layer.

The self-limiting effect also allows the maximum increase in surface area that can be achieved by the mesopore process within the capacitor trench to be attained with the oxide growth. Since mesopores have diameters in the region of 10 nm, the situation may also arise in which, as a result of the partial oxidation of 5 nm of silicon and the associated swelling of the oxidized silicon layer, the mesopores are completely filled with oxide. In this case, the electrochemical oxidation once again comes to a standstill.

The end point of the electrochemical oxide formation is detected as a result of current no longer flowing between anode and cathode, and the voltage between the semiconductor substrate and the cathode is interrupted.

After the electrochemical oxide formation and the removal of the silicon oxide which has formed, if appropriate the ohmic back-surface contact is removed again, if it disrupts the further process sequence. Then, the method for fabricating a DRAM memory arrangement is continued in the usual way, for example, as described in International Publication WO 01/17014.

According to a third embodiment, the inventive process for oxidizing the surface of capacitor trenches is used to form a sacrificial oxide layer during the formation of a spacer.

Figure 9:
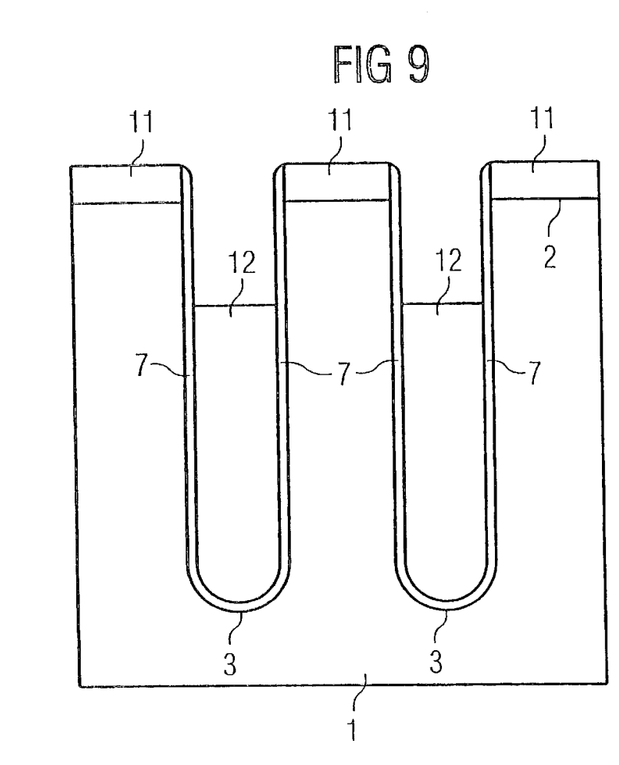
FIG. 9 shows a cross section through a silicon substrate in order to explain a third embodiment of the inventive process.

In FIG. 9, reference numeral 1 denotes a semiconductor region with a silicon surface region 2. A 5 nm thick $SiO_2$ layer (not shown) and a 200 nm thick $Si_3N_4$ layer 11 provided as a protective layer are applied to the surface. Then, as has been described above with reference to the first and second embodiments, an ohmic back-surface contact is produced for the electrochemical oxidation.

Then, a 1000 nm thick BSG layer (not shown) is applied to the front surface of the substrate as hard mask material.

The BSG layer, the $Si_3N_4$ layer 11 and the $SiO_2$ layer are patterned in a plasma etching process using $CF_4/CHF_3$ and a photolithographically produced mask (not shown), so that a hard mask is formed. After removing the mask that has been produced by photolithography, in a further plasma etching process using $HBr/NF_3$, trenches 3 are etched using the hard mask as an etching mask. Then, the BSG layer is removed by wet etching using $H_2SO_4/HF$.

The trenches 3 have a depth, for example, of 5 $\mu$m, a width of 100×250 nm and are spaced apart by 100 nm.

Then, a 10 nm thick silicon oxide layer 7 is produced by the inventive process.

For this purpose, the structure shown in FIG. 1 is used once again. In this case, the cell is filled with an aqueous dilute acid (e.g. a 0.01 mol sulfuric or hydrochloric acid) without the addition of an agent for etching the silicon oxide layer.

The back-surface contact of the semiconductor substrate 1 is connected to the anode of a voltage source 8 as described above with reference to the first or second embodiment.

With regard to the back-surface contacting of the semiconductor substrate, it is important, as has already been mentioned above with reference to the first and second embodiments, to produce a large-area electrical contact to the substrate. Any known processes, such as those which are known, for example, from mesopore etching processes, can be used for this purpose.

Opposite the substrate surface, a cathode is arranged in the cell and is connected to the voltage source 8. A voltage corresponding to the oxide thickness that will be formed is set at the voltage source 8. Typical voltages are between 0 volts and few tens of volts. As soon as the intended oxide thickness is reached, the applied voltage drops off predominantly over the oxide layer, with the result that the further growth of oxide comes to a standstill.

The end point of the electrochemical oxide formation is detected as a result of current no longer flowing between the anode and the cathode, and the voltage between the semiconductor substrate and the cathode is interrupted.

At this point in the DRAM fabrication process, this process for forming oxide is advantageous, in particular, since the formation of the silicon oxide layer on the trench walls only narrows the trench diameter to an insignificant extent, which greatly simplifies further processing.

If appropriate, as soon as the oxide formation has ended or later, the ohmic back-surface contact is removed again if it disrupts the further process sequence. By way of example, the highly p-doped layer can be removed by wet chemical etching.

The $SiO_x$ layer 7 formed by the process described covers at least the walls of the trenches 3. A polysilicon filling 12, the surface of which is arranged 1000 nm below the surface, is produced in each of the trenches 3 by depositing a 200 nm thick polysilicon layer, chemical mechanical polishing down to the surface of the $Si_3N_4$ layer 11, and etching back the polysilicon layer using $SF_6$. If appropriate, the chemical mechanical polishing can be dispensed with. The polysilicon filling 12 serves as a sacrificial layer for the subsequent $Si_3N_4$ spacer deposition. Then, the $SiO_2$ layer 7 on the walls of the trenches 3 is etched isotropically.

Figure 10:
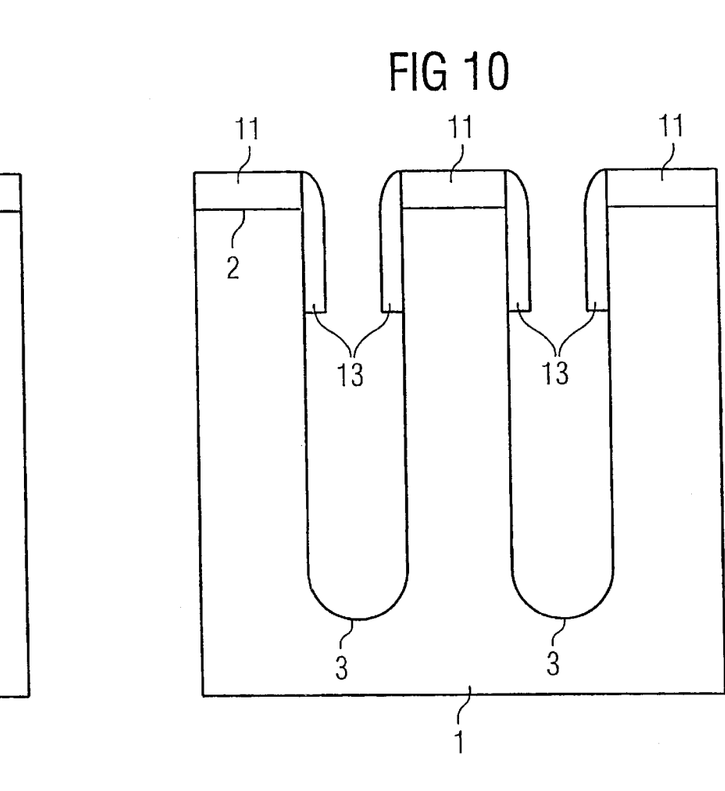
FIG. 10 shows a cross section through a silicon substrate in order to explain the third embodiment of the inventive process.

Next, in a CVD process, a 20 nm thick spacer layer 13, which includes silicon nitride and/or silicon dioxide, is deposited and etched in an anisotropic plasma etching process using $CHF_3$. In the finished memory cell, the spacer layer 13 that has just been deposited is used to disconnect the parasitic transistor which would otherwise form at this location and therefore takes over the role of the insulation collar.

Next, polysilicon is etched selectively with respect to $Si_3N_4$ and $SiO_2$ using $SF_6$. In the process, the polysilicon filling 12 is in each case completely removed from the trench 3. The part of the $SiO_2$ layer 7 which has now been uncovered is removed by etching using $NH_4F/HF$ (cf. FIG. 10).

Then, the method for fabricating a DRAM memory arrangement is continued in the usual way, for example, as described in International Publication WO 01/17014.

We claim:

1. A process for an electrochemical oxidation of a semiconductor substrate, which comprises:
    providing a semiconductor substrate having at least one surface region formed with recesses being spaced apart from one another by a spacing, said surface region having silicon and a predetermined doping;
    providing an electrolyte in contact with the surface region;
    applying a voltage between the semiconductor substrate and a cathode configured in the electrolyte to bring about a reaction between the surface region and the electrolyte in order to form silicon oxide;
    determining that the electrochemical oxidation has ended based on a self-limiting effect; and
    interrupting the voltage between the semiconductor substrate and the cathode.

2. The process according to claim 1, wherein: the self-limiting effect is brought about as a result of reaching a predetermined oxide thickness when the voltage between the semiconductor substrate and the electrolyte is a given voltage and when the electrolyte has a given composition.

3. The process according to claim 1, wherein: the self-limiting effect is brought about as a result of a layer thickness between two adjacent ones of the recesses falling below a minimum residual silicon layer thickness when the voltage between the semiconductor substrate and the electrolyte is a given voltage and when the electrolyte has a given composition.

4. The process according to claim 1, which comprises:
    setting the voltage and a composition of the electrolyte such that a following relationship applies:

$d \geq 2*$(an extent of the space charge region+an oxide thickness that will be produced);

where d is a layer thickness of the silicon that is between two adjacent ones of the recesses; and
    the extent of the space charge region is dependent on a level of an effective voltage acting over the space charge region, and the effective voltage is dependent on the voltage that is applied and a composition of the electrolyte.

5. The process according to claim 1, wherein: the electrolyte includes an agent for etching silicon oxide.

6. The process according to claim 1, wherein: surfaces of capacitor trenches are oxidized.

7. The process according to claim 1, wherein: surfaces of mesopores are oxidized.

8. The process according to claim 1, wherein: diameters of trenches are widened to form trench capacitors.

9. The process according to claim 1, wherein: diameters of mesopores are widened.

* * * * *